(12) United States Patent
Hsu et al.

(10) Patent No.: US 7,615,285 B2
(45) Date of Patent: Nov. 10, 2009

(54) FABRICATION METHOD AND STRUCTURE OF AN ITO ANODE CONTAINING NICKEL POINTS FOR AN OLED TO SELECTIVELY LIGHT

(75) Inventors: Ching-Ming Hsu, Tainan County (TW); Wen-Tuan Wu, Tainan County (TW); Chung-Lin Tsai, Tainan County (TW)

(73) Assignee: Southern Taiwan University, Tainan (TW)

( * ) Notice: Subject to any disclaimer, the term of this patent is extended or adjusted under 35 U.S.C. 154(b) by 484 days.

(21) Appl. No.: 11/471,478

(22) Filed: Jun. 21, 2006

(65) Prior Publication Data

US 2007/0298222 A1    Dec. 27, 2007

(51) Int. Cl.
*B32B 15/04* (2006.01)
*H05B 33/14* (2006.01)

(52) U.S. Cl. ........................ 428/432; 428/690; 428/917; 313/504; 313/506

(58) Field of Classification Search ........................ None
See application file for complete search history.

(56) References Cited

U.S. PATENT DOCUMENTS

2004/0245531 A1 * 12/2004 Fuii et al. ...................... 257/88
2008/0248240 A1 * 10/2008 Shi ............................ 428/141

* cited by examiner

*Primary Examiner*—Ling Xu
(74) *Attorney, Agent, or Firm*—Bacon & Thomas, PLLC

(57) ABSTRACT

A fabrication method of an indium tin oxide (ITO) anode containing point nickel for an organic light emitting diode (OLED) to selectively light includes various processes of preparing an ITO substrate with an anode having plural point grooves, of forming a nickel film on the anode, and of grinding the nickel film to leave the point grooves fitted with nickel. Therefore, the nickel spots of the ITO anode are lit up earlier than the pure ITO anode when the OLED is turn on. Because the nickel spots have a lower resistance, current can aggregate in these spots collectively, reducing demerit of cross-talk happening often in a conventional passive OLED panel circuit. The structure of the OLED includes an ITO substrate with an anode provided point grooves deposited with nickel, a hole transport layer on the anode, and an electron transport layer on the hole transport layer.

4 Claims, 2 Drawing Sheets

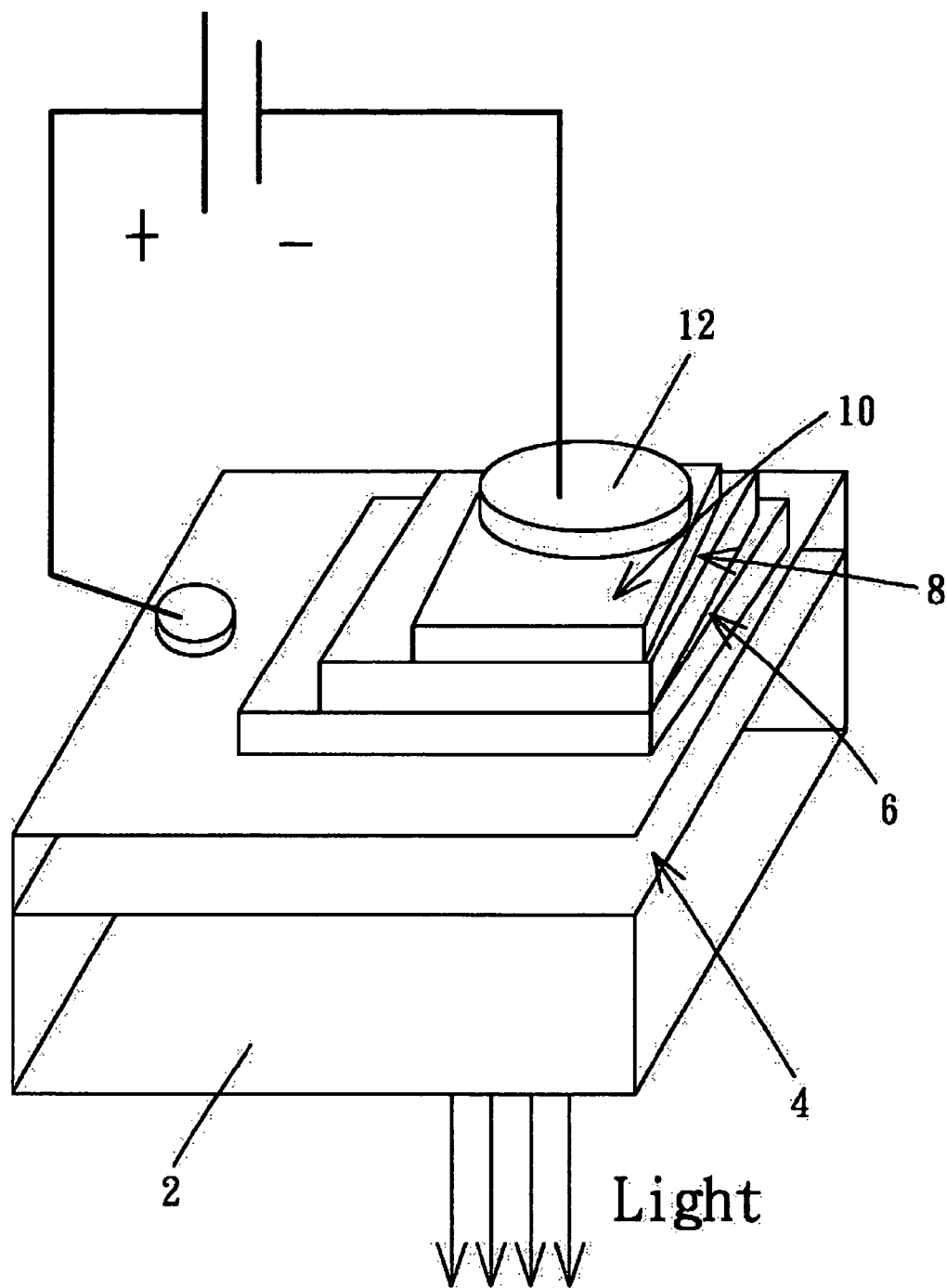
FIG.1 *(PRIOR ART)*

Preparing an ITO substrate provided with an anode and then depositing a pure ITO film by D.C. magnetron sputtering.

↓

Forming plural point grooves on the ITO anode by optical lithography and then depositing a nickel film on it by RF magnetron sputtering.

↓

Grinding off the nickel film entirely except those filled in the point grooves used as an anode layer of an OLED.

*FIG.2*

FABRICATION METHOD AND STRUCTURE OF AN ITO ANODE CONTAINING NICKEL POINTS FOR AN OLED TO SELECTIVELY LIGHT

BACKGROUND OF THE INVENTION

1. Field of the Invention

This invention relates to a fabrication method and a structure of an indium tin oxide (ITO) anode containing nickel points for an organic light emitting diode (OLED) to selectively light.

2. Description of the Prior Art

As known universally, an OLED (organic light emitting diode) has a structure and a manufacturing procedure simpler than those of an LCD nowadays. Moreover, an OLED can light itself and be combined with a flexible substrate, and has no limitation of viewing angle, low power consumption, high brightness and a short response time. Therefore, an OLED can potentially to be applied to all kinds of audio and video displayers, such as mobile audio, cell phone, MP3, digital camera, PDA, electronic book, back light source of LCD, television and source of white light etc.

FIG. 1 is a diagram of a conventional multi-layer OLED device, which is provided with an ITO (indium tin oxide) substrate 2 possessing an anode 4 that is mostly a transparent conductive electrode, and a hole transport layer (HTL) 6, a light emitting layer (LEL) 8 and an electron transport layer (ETL) 10 located orderly on the anode 4. Finally, a metallic cathode 12 is fabricated on the ETL 10 by vacuum vapor deposition to complete such a conventional multi-layer OLED.

When a positive bias is applied to the OLED, an electric field is to be formed in the OLED. By the time, the electron and the hole are respectively injected to the metallic cathode 12 and anode 4. The electron is to pass through the ETL 10 and the hole is to pass through HTL 6 after the electron and the hole have surpassed the energy barrier of the cathode interface and the anode interface respectively. Then, the electron and the hole meet at the LEL 8 to form a neutralized but excited electron-hole pair, which is to release photon energy by radiation and then, return to ground state. What is mentioned above is a process of electro-luminescence.

As a related conventional skill of OLED, U.S. Pat. No. 6,420,031 B1, titled as "Highly transparent non-metallic cathode", employs ITO as a non-metallic layer and copper phthalocyanine (CuPc) as an electron-injecting interface layer. The electron interface with low resistance is formed only when the ITO is set in an organic layer but not when the organic layer is set on the ITO. The CuPc has advantages that: (1) it is used as a protection layer to keep an organic layer underlying from being damaged during the ITO sputtering process; and (2) it is used as an electron-injecting region so as to combine with The ITO layer to transport electron to a neighboring electron transporting layer. But, a highly transparent cathode applied to the OLED in the patent is insufficient to transport because it injects electron to the electron transporting layer without optimization and the materials used are not proper to present the whole range of colors.

As mentioned previously, an electric field is to be formed in the OLED when a positive bias is applied to the OLED. By the time, the electron and the hole are respectively injected to the cathode and the anode. And, the key factor obtaining high injection efficiency is that the electron and the hole must surpass the energy barrier of the cathode interface and the anode interface respectively. In addition, there is always a cross-talk problem for a conventional passive OLED panel circuit.

SUMMARY OF THE INVENTION

The first objective of this invention is to offer a fabrication method of an ITO anode containing point nickel for an OLED to selectively light. The processes goes by: (a) preparing an ITO substrate provided with an anode having plural point grooves, (b) depositing a nickel film on the anode, and (c) grinding off the nickel film except those filled in the point grooves.

The second objective of this invention is to offer a structure of an ITO anode containing nickel points for an OLED to selectively light, at least including a substrate provided with an anode having plural point grooves deposited with nickel, a hole transport layer formed on the anode and an electron transport layer formed on the hole transport layer.

In accordance with what is mentioned above, the point grooves deposited with nickel on the ITO anode are to have a lower resistance, allowing current to aggregate in them, able to reduce cross-talk happening often in a conventional passive OLED panel circuit.

BRIEF DESCRIPTION OF DRAWINGS

This invention is better understood by referring to the accompanying drawings, wherein:

FIG. 1 is an illustrating perspective view of a conventional multi-layer OLED device; and FIG. 2 is a flow chart of a preferred embodiment of a fabrication method and a structure of an indium tin oxide (ITO) anode containing point nickel for an organic light emitting diode (OLED) to selectively light in the present invention.

DETAILED DESCRIPTION OF THE PREFERRED EMBODIMENT

A preferred embodiment of a fabrication method of an indium tin oxide (ITO) anode containing point nickel for an organic light emitting diode (OLED) to selectively light is shown in FIG. 2, a flow chart.

First of all, an ITO substrate provided with an anode surface is deposited with a pure ITO film via direct current magnetron sputtering. Next, the surface of the pure ITO film is created with plural cavities by standard optical lithography. Then a nickel film is deposited on the pure ITO film by RF magnetron sputtering. Finally, the nickel film is to be ground off entirely but those filled in the cavities, forming an ITO film with point nickel, employed as an anode layer of OLED device.

Of course, an ITO film containing point nickel and formed by the process mentioned above should further include at least a hole transport layer lying on the anode of the ITO substrate and an electron transport layer formed on the hole transport layer if applied for an OLED. But these processes are well known art used in the conventional OLED, not to be describes here.

It has been proved experimentally that the work function of the anode of the ITO film containing nickel points is higher than that of a traditional pure ITO film (approx. 4.6 eV). So far, the work function of the anode of the ITO film containing nickel points is as high as 5.0 eV, able to tremendously lessen a potential barrier between the anode of the ITO and the hole transport layer, reducing about 2.3V of threshold voltage and turn-on voltage of an OLED device, advancing a hole injection efficiency.

Therefore, because the turn-on voltage is dropped greatly, the nickel spots of the ITO anode are lit up earlier than the pure ITO anode when the OLED is turn on. That is so-called "selective lighting" for an OLED.

Moreover, because the nickel spots of the ITO anode have a lower resistance, current can aggregate in these spots collectively, able to reduce cross-talk happening often in a conventional passive OLED panel circuit.

In addition, the roughness of the ITO anode with or without nickel is improved owing to the employment of grounding, able to effectively reduce productivity of black pixel after having the OLED device driven, relatively lengthening the service life of the OLED.

The substrate mentioned previously can be replaced with glass, plastics and the like, as long as able to obtain the same or similar effects.

Next, the structure of an OLED that is provided with an ITO anode mingled with nickel spots to selectably light includes a substrate provided with an anode having plural nickel spots, a hole transport layer formed on the anode of the ITO substrate, and an electron transport layer formed on the hole transport layer.

While the preferred embodiment of the invention has been described above, it will be recognized and understood that various modifications may be made there in and the appended claims are intended to cover all such modifications that may fall within the spirit and scope of the invention.

What is claimed is:

1. A structure of an indium tin oxide (ITO) anode containing nickel points for an organic light emitting diode (OLED) to selectively light, said structure at least comprising:
   a substrate provided with said anode having plural point grooves for depositing nickel points therein;
   a hole transport layer formed on said anode of said substrate; and
   an electron transport layer formed on said hole transport layer.

2. The structure of an indium tin oxide (ITO) anode containing point nickel for an organic light emitting diode (OLED) to selectively light as claimed in claim 1, wherein said substrate is glass.

3. The structure of an indium tin oxide (ITO) anode containing nickel points for an organic light emitting diode (OLED) to selectively light as claimed in claim 1, wherein said substrate comprises plastics.

4. A structure including an indium tin oxide (ITO) anode containing nickel points for an organic light emitting diode (OLED) to selectively light, said structure at least comprising:
   a substrate provided with said anode having plural point grooves containing deposited nickel points therein, said substrate is glass or comprises plastics;
   a hole transport layer formed on said anode of said substrate; and
   an electron transport layer formed on said hole transport layer.

* * * * *

UNITED STATES PATENT AND TRADEMARK OFFICE
CERTIFICATE OF CORRECTION

| | | |
|---|---|---|
| PATENT NO. | : 7,615,285 B2 | Page 1 of 1 |
| APPLICATION NO. | : 11/471478 | |
| DATED | : November 10, 2009 | |
| INVENTOR(S) | : Hsu et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 626 days.

Signed and Sealed this

Nineteenth Day of October, 2010

David J. Kappos
*Director of the United States Patent and Trademark Office*